United States Patent
Janssen

(10) Patent No.: US 11,486,770 B2
(45) Date of Patent: Nov. 1, 2022

(54) METHOD AND MEASURING SYSTEM FOR MONITORING A LINE FOR CHANGED AMBIENT CONDITIONS

(71) Applicant: LEONI KABEL GMBH, Roth (DE)

(72) Inventor: Bernd Janssen, Friesoythe ot Neuscharrel (DE)

(73) Assignee: LEONI Kabel GmbH, Roth (DE)

( * ) Notice: Subject to any disclaimer, the term of this patent is extended or adjusted under 35 U.S.C. 154(b) by 316 days.

(21) Appl. No.: 16/644,602

(22) PCT Filed: Sep. 5, 2018

(86) PCT No.: PCT/EP2018/073881
§ 371 (c)(1),
(2) Date: Mar. 5, 2020

(87) PCT Pub. No.: WO2019/048487
PCT Pub. Date: Mar. 14, 2019

(65) Prior Publication Data
US 2021/0063249 A1    Mar. 4, 2021

(30) Foreign Application Priority Data

Sep. 5, 2017  (DE) .......................... 102017215517.5

(51) Int. Cl.
*G01K 7/16*    (2006.01)
*G01K 3/10*    (2006.01)
(Continued)

(52) U.S. Cl.
CPC ................. *G01K 7/16* (2013.01); *G01K 3/10* (2013.01); *H04B 3/48* (2013.01); *G01R 19/0084* (2013.01); *G01R 31/08* (2013.01); *G01R 31/11* (2013.01)

(58) Field of Classification Search
CPC ...... G01K 7/16; G01K 3/10; G01K 2007/166; G01K 7/343; H04B 3/48; H04B 3/54;
(Continued)

(56) References Cited

U.S. PATENT DOCUMENTS 5,530,365 A * 6/1996 Lefeldt .................. G01R 31/11
324/543
6,781,386 B2   8/2004 Le Henaff
(Continued)

FOREIGN PATENT DOCUMENTS

CA    2969483 A1    6/2016
CN    1794604 A     6/2006
(Continued)

*Primary Examiner* — Akm Zakaria
(74) *Attorney, Agent, or Firm* — Laurence A. Greenberg; Werner H. Stemer; Ralph E. Locher

(57) ABSTRACT

A method for monitoring a line for a change in ambient conditions. The line includes a measurement line of a predetermined length which has a measuring conductor enclosed in an insulation with a known dielectric coefficient. An analog signal of defined frequency is generated and injected at a feed site. The signal is reflected at a predetermined reflection site and a resulting signal amplitude is measured at a defined measuring point. A measure for the ambient condition, particularly a temperature, is determined from the signal amplitude.

17 Claims, 1 Drawing Sheet

(51) Int. Cl.
  *H04B 3/48* (2015.01)
  *G01R 19/00* (2006.01)
  *G01R 31/08* (2020.01)
  *G01R 31/11* (2006.01)

(58) Field of Classification Search
  CPC .... G01R 19/0084; G01R 31/08; G01R 31/11; H01B 7/32
  See application file for complete search history.

(56) References Cited

U.S. PATENT DOCUMENTS

| | | | |
|---|---|---|---|
| 7,529,176 | B2 | 5/2009 | Verlinden et al. |
| 9,885,618 | B2 | 2/2018 | Wen et al. |
| 10,359,322 | B2 | 7/2019 | Sommervogel et al. |
| 10,359,462 | B2 | 7/2019 | Fantoni |
| 10,488,273 | B2 | 11/2019 | Koeppendoerfer et al. |
| 2003/0173399 | A1 | 9/2003 | Le Henaff |
| 2004/0015311 | A1* | 1/2004 | Furse ............... G01R 31/11 702/108 |
| 2008/0024119 | A1* | 1/2008 | Gualtieri ............... G01B 7/003 374/E7.018 |
| 2009/0228222 | A1 | 9/2009 | Fantoni |
| 2013/0100982 | A1 | 4/2013 | Gase et al. |
| 2013/0223599 | A1 | 8/2013 | Drooghaag et al. |
| 2017/0261383 | A1* | 9/2017 | Sommervogel ......... G01K 7/16 |

FOREIGN PATENT DOCUMENTS

| | | |
|---|---|---|
| CN | 102811882 A | 12/2012 |
| CN | 103250404 A | 8/2013 |
| CN | 104937427 A | 9/2015 |
| CN | 105190268 A | 12/2015 |
| CN | 105829845 A | 8/2016 |
| DE | 60118586 T2 | 11/2006 |
| DE | 102010003470 A1 | 10/2011 |
| DE | 102013227051 A1 | 6/2015 |
| EP | 0487730 A1 | 6/1992 |
| JP | S63285432 A | 11/1988 |
| WO | 2009115127 A1 | 9/2009 |
| WO | 2015091552 A1 | 6/2015 |

* cited by examiner

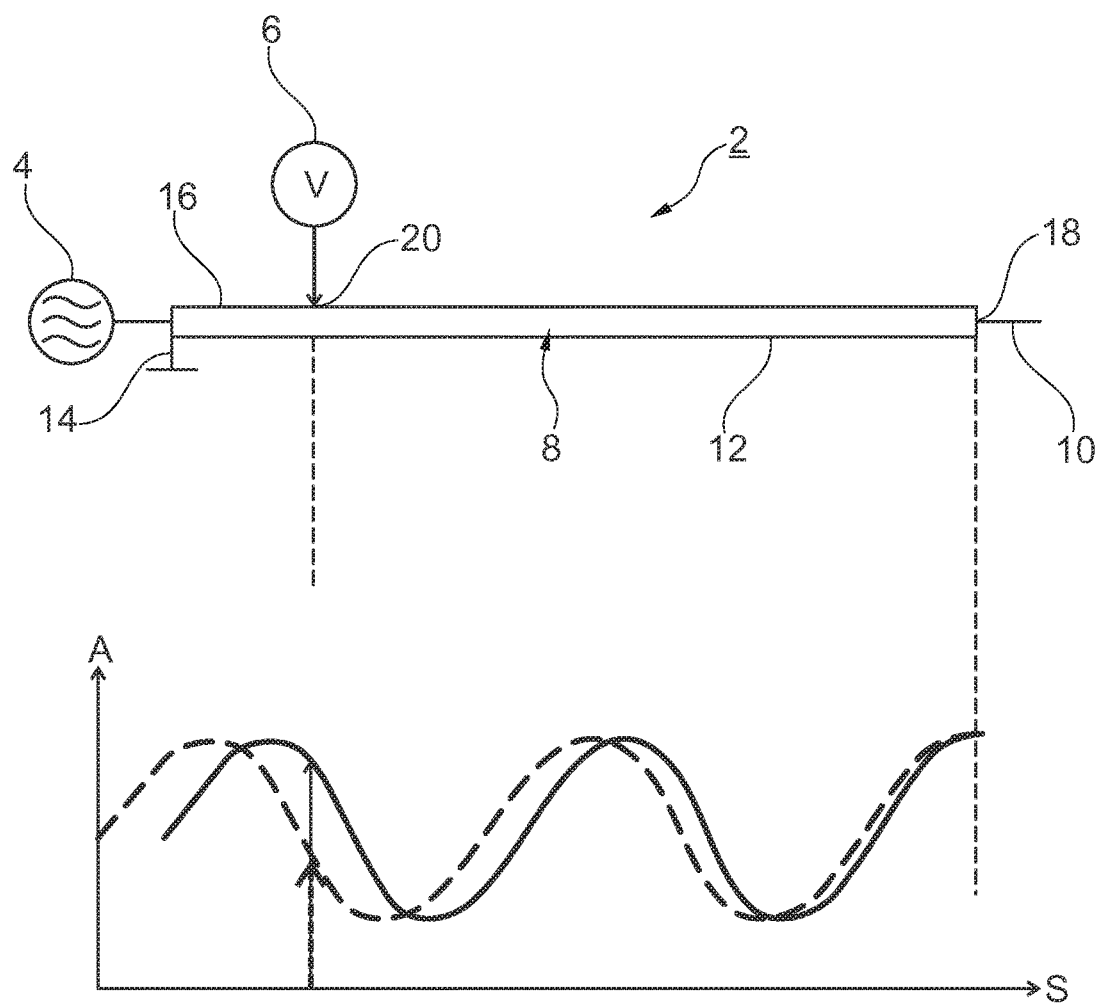

METHOD AND MEASURING SYSTEM FOR MONITORING A LINE FOR CHANGED AMBIENT CONDITIONS

BACKGROUND OF THE INVENTION

Field of the Invention

The invention relates to a method and to a measuring system for monitoring a line for changed ambient conditions.

The line is an electrical line comprising at least one conductor, which is surrounded by insulation. The conductor surrounded by insulation is also referred to hereafter as a core. The insulation has a predefined dielectric constant. The dielectric constant influences signal transmission within the electrical conductor.

Frequently, multiple cores are combined to form a line. In many applications, for example in the automotive field, lines are subjected to a wide variety of loads, which are frequently unknown in terms of the duration and strength thereof. In addition, essentially diverse and varied ambient conditions, and in particular thermal influences, often cannot be assessed, or cannot be sufficiently assessed, to be able to predict wear of a line. So as to be able to ensure a particular minimum service life, a line is typically over-designed.

In the field of e-mobility, the charging of electrically powered motor vehicles is increasingly gaining in importance. So as to keep the charging duration short, high charging currents are provided in this regard in the future. This results in a high temperature load on the corresponding charging cables, which can be monitored.

BRIEF SUMMARY OF THE INVENTION

Proceeding therefrom, it is the object of the invention to enable simple and cost-effective monitoring of a line for changed ambient conditions.

According to the invention, the object is achieved by a method as claimed and by a measuring system as claimed. Advantageous embodiments and refinements are the subject matter of the dependent claims. The comments provided in connection with the method also apply analogously to the measuring system, and vice versa.

The method according to the invention is used to monitor a line for changed ambient conditions. The line comprises a measuring line having a predetermined length, which includes a measuring conductor surrounded by insulation having a known dielectric constant. The line can include further line components, and in particular further electrical cores or other electrical lines, apart from the measuring line. In a preferred variant embodiment, however, the line only comprises the measuring line.

Furthermore, an analog signal is generated, which is fed into the measuring line at a feed site. The measuring line is designed purposefully in such a way that the signal is reflected, in particular strongly, and preferably completely or essentially completely, at a known, fixed reflection site, and that a reflected signal component is returned in the measuring conductor. A signal amplitude is now measured at a stationary measuring site, and a measure for the changed ambient condition is ascertained from this signal amplitude.

This ambient condition or also ambient parameter is, in particular, the temperature. The term ambient condition or ambient parameter shall be understood in general terms in this context. According to a first variant embodiment, it is an ambient condition outside the line. In this case, another component is thus monitored generally by way of the measuring line. As an alternative, the condition is an internal ambient condition, for example a condition of the line itself, such as the temperature of the line. In the latter case, in which an inherent, internal condition of the line being monitored is involved, the monitoring method is thus used to monitor the line itself. Based on the ascertained values for the changed inherent condition, additionally forecasts are preferably derived for the wear of the line.

The measuring line is preferably designed, in the overall, such that a standing wave is formed between the feed site and the reflection site.

The method proposed herein is, in principle, initially based on the deliberation that the velocity of propagation of the signal within the measuring line is dependent on the dielectric constant of the insulation. In particular when the material for the insulation is selected appropriately, the dielectric constant varies with the ambient conditions, and in particular with the temperature. A changing ambient temperature thus affects the respective velocity of propagation of the signal in the measuring line via the dielectric constant. The changed velocity of propagation essentially results in a shift of the phase of the signal at the defined, fixed measuring site, so that the signal amplitude varies at the measuring site as a function of the temperature. This signal amplitude is thus a measure for the changed velocity of propagation, and thus also a measure for the changed ambient condition (temperature). By evaluating the signal amplitude at the fixed measuring site, conclusions are thus drawn as to the current ambient condition, and in particular the temperature. Preferably, only the signal amplitude is used for the evaluation.

Due to the design of the line having the strong reflection at the reflection site, and the preferred embodiment of a standing wave, the components of the signal in general are superimposed on those of the reflected signal. At a predefined frequency, a predefined line length, that is, a predefined length between the feed site and the reflection site, and a predefined measuring site, in general a defined voltage amplitude arises at the measuring site, as a function of the temperature. The measured signal amplitude is the amplitude of the mutually superimposed signal components of the fed signal and of the reflected signal.

In an ideal line, the fed signal and the reflected signal would cancel each other out with total reflection. This is not the case, however, due to transmission losses as a result of, for example, attenuation in the case of a real line, or also with incomplete total reflection. The reflected signal is smaller than the fed signal.

The conclusion as to the changed ambient condition, and in particular the temperature, from the signal amplitude is selectively drawn by way of an algorithm, or else by a comparison to comparison values or reference values for the measured signal amplitude.

The use of an analog signal is of particular significance for the present method. This is generally considered to be a stepless signal having a continuous, uninterrupted signal profile, in contrast to a digital signal, which typically has a stepped sequence of (two) discrete states (0, 1). This has the advantage that this has a considerably lower frequency in comparison with digital measuring pulses. As a result, the attenuation of the signal is comparatively low.

The signal is, in general, a periodic signal having a predefined frequency, and in particular a continuously changing signal having a steadily rising or falling amplitude, specifically a sinusoidal or cosinusoidal signal. In addition, there is also the option, in principle, to use other signal geometries, such as triangular signals.

The known, defined reflection site is preferably an end of the measuring line. The end of the measuring line is advantageously open, that is, it is a free end that is electrically contactless or, for example, connected to ground. This open end ensures the desired high reflection and the creation of the desired standing wave. In principle, however, other measures for creating the high reflection and the standing wave are also possible, such as a short circuit.

As was already mentioned above, real lines are lines that are lossy, and the reflected wave (the reflected signal) is thus smaller at the start of the line. As the dielectric constant changes (as a function of the ambient condition, specifically the temperature), so does the line capacitance and hence the insertion loss and the wave impedance. When the site of the voltage measurement in conjunction with the frequency is selected appropriately, two or even three effects (phase shift, increase in attenuation and reduction in wave impedance) at the measuring site add up. According to a preferred embodiment, this is utilized to ascertain also a change in the (insertion) loss or the reduction in wave impedance, in addition or as an alternative to the temperature. Example: Relative permittivity increases with the temperature. At room temperature, transmitted and reflected waves maximally add up vectorially (approximately 0 degrees phase shift). The site of the measurement is located at one of these maxima. When the temperature increases, the vector sum (=amplitude) decreases due to the phase shift. In addition, the sum also decreases due to the higher line attenuation of the reflected signal. Moreover, due to the increasing mismatch, more signal energy is reflected at the input of the line (adaptation at room temperature, mismatch at higher temperatures), that is, the measured amplitude decreases even further.

The frequency of the signal is advantageously in the range of several 10 KHz to 1000 MHz. The frequency is preferably overall in the range between 0.5 and 500 MHz, and preferably 200 to 400 MHz. The frequencies in the range of several hundred MHz are used, in particular, for short lines having a line length of less than 5 meters, for example. In this way, in particular also effects, such as an increase in attenuation or a mismatch, can be ascertained, in addition to the phase shift. The predefined frequency preferably decreases with increasing line length. This dependence of the frequency on the line length is of particular advantage since signal attenuation usually increases at higher frequencies, which thus can have a negative effect in certain circumstances in the case of longer measuring conductors. Due to the reciprocal relation between the line length of the measuring conductor and the frequency, the present method, using analog measuring signals, is therefore suitable, in particular, for larger line lengths. The frequency is preferably constant during the measurement, enabling a particularly simple measuring system. As an alternative, however, there is also the option, in principle, to vary the frequency during the measurement.

In general, the line lengths of the measuring conductor between the feed site and the reflection site are preferably in the range of several meters to several 10 m. In principle, however, the length of the measuring conductor is not restricted. The length of the measuring conductor can also be several 10 m up to 100 m or several 100 m.

In a preferred embodiment, the measuring line, in general, has a dual function and is used, for example, for power supply purposes, in addition to the measuring function. The generally high-frequency signal is modulated onto a direct current or also an alternating current (for example, with a frequency of 50 Hz) of the power supply. As a result of this measure, the option thus exists to integrate an additional measuring function in conventional cable designs, without having to run an additional measuring conductor. In general, an existing core of a cable design is thus preferably used as a measuring line or a measuring core.

Specifically, this existing core is a supply core, by way of which a current, in particular a direct current, is transmitted during operation. The supply current is a charging current, for example. In general, currents in the range of greater than 1 ampere, preferably of greater than 10 amperes, greater than 50 amperes or greater than 100 amperes are transmitted. The method described herein is preferably used to monitor the temperature, specifically of a charging cable, which can be used to charge a battery of a vehicle driven by an electric motor. The measuring line is, in particular, a so-called "power core" of the charging cable. The in-coupling of the signal preferably takes place in a contactless (capacitive/inductive) manner.

In general, the measuring line is run in a component to be monitored, and more particularly for monitoring the temperature. According to a first embodiment, the component is, in general terms, a cable that is to be monitored itself, such as the aforementioned charging cable. The measuring line is integrated within this electrical cable. Specifically, this is a cable that is run during operation in a motor vehicle, for example in the motor area.

As an alternative, the component to be monitored is a part, such as a motor part or another part, the temperature of which is to be monitored and/or checked. The component can also be a compound, for example a hardening compound, the temperature of which is to be monitored. For example, it is a casting compound in the construction industry, for example concrete. In this case, the measuring line is embedded within the compound and remains therein even after the compound has hardened.

With respect to the measuring system, all feed and evaluation components are preferably integrated within a shared monitoring unit. Only the measuring line is connected to this monitoring unit, which is thus a module and, for this purpose, is disposed in a shared housing, for example, or on a shared carrier, such as a circuit board. Specifically, this is done via a reversible connection option at contact terminals.

An embodiment of the invention will be explained in greater detail hereafter with reference to the FIGURE.

BRIEF DESCRIPTION OF THE DRAWING

The FIGURE shows a measuring system comprising a measuring line and having different signal profiles in a highly simplified, schematic representation.

DETAILED DESCRIPTION OF THE INVENTION

The measuring system 2 shown in the FIGURE comprises a signal generator 4, a voltmeter 6 and a measuring line 8 as essential components. The internal resistance of the signal generator is adapted to the surge impedance of the measuring line 8. The measuring line 8, in turn, comprises a central measuring conductor 10, which is surrounded by insulation 12, applied in particular by way of extrusion coating, having a known, temperature-dependent dielectric constant. In addition, the measuring line 8 preferably also includes a shield, which forms an outer conductor, which is preferably connected to a ground terminal 14 having a defined reference potential, and in particular ground potential. The measuring line 8 can be a coaxial cable, for example.

An analog signal, specifically a sinusoidal or cosinusoidal signal having a particular predetermined frequency, for example in the range between 1 and 1000 megahertz, is generated by way of the signal generator 4. The frequency of the signal is kept constant during the measurement, and is not changed. The generated signal is fed into the measuring conductor 10 at a feed site 16 and travels through the entire length of the measuring conductor 10, to a reflection site 18 at which at least the majority of the signal is reflected, whereby a reflected signal is generated and returns in the measuring conductor 10. The reflection site 18 is an open line end, for example, that is, the measuring conductor 10 is electrically contactless at this end. Due to the special design, the length between the feed site and the reflection site 18 is thus known.

Moreover, the voltmeter 6 is designed to tap the signal amplitude at a fixed, defined measuring site 20.

A standing wave, as is shown in the bottom half of the FIGURE, is created within the measuring conductor 10 due to the high degree of reflection at the reflection site 18. The illustrated waves are envelopes. The FIGURE illustrates an idealized behavior of the measuring line without attenuation. In a real line, the amplitude of the reflected signal is lower due to attenuation.

As a result, the "amplitude of the envelope" decreases under the influence of attenuation. Likewise, less signal energy is fed in the case of a mismatch (insertion loss). These effects are not shown in the simplified FIGURE.

Due to the temperature dependence of the dielectric constant of the insulation 12, the velocity of propagation of the signal within the measuring line 8 changes with the temperature. The two sinusoidal signal profiles shown schematically in the bottom half of the FIGURE indicate the location-dependent amplitude for two different temperatures. When the temperature changes, the phase position of the signal shifts, so that a noticeable change of the signal amplitude occurs at the fixed measuring site 20. The length of the two indicated arrows, which are directed at the two signal profiles at the measuring site 20, represent the respective signal amplitude measured for the particular signal profile at the measuring site 20.

The voltmeter 6 is furthermore connected to an evaluation unit, which is not shown in detail here. Conclusions as to the prevailing ambient condition, and in particular the temperature, are drawn in this evaluation unit based on the measured signal amplitude. This takes place, for example, by a comparison to stored reference data. In general, it is thus possible to detect the velocity of propagation, for example, and, derived therefrom, the temperature in the surrounding area of the measuring line or the measuring line itself, based on the signal amplitude.

The invention claimed is:

1. A method for monitoring a line for a change in an ambient condition, the method comprising:
    providing the line with a measuring line having a predetermined length and including a measuring conductor surrounded by an insulation;
    generating an analog signal and feeding the signal into the measuring line at a feed site, the analog signal being a periodic, continuously changing signal with a given frequency with steadily rising or falling amplitude;
    reflecting the signal at a known reflection site, a reflected signal component being returned in the measuring conductor;
    measuring a signal amplitude at a fixed measuring site, wherein a changed ambient condition leads to a changed velocity of propagation of the signal and thus a shift in the phase of the signal at a fixed measurement location, so that the signal amplitude varies at the fixed measurement location and that the signal amplitude is a measure for the changed ambient condition; and
    ascertaining a measure for the changed ambient condition based on the signal amplitude at the fixed measuring site.

2. The method according to claim 1, which comprises forming a standing wave between the feed site and the reflection site.

3. The method according to claim 1, wherein the known reflection site is an end of the measuring line.

4. The method according to claim 3, wherein the end of the measuring line is an open end.

5. The method according to claim 1, wherein the changed ambient condition is a condition selected from the group consisting of a temperature, an attenuation of the measuring line, and an insertion lass of the measuring system.

6. The method according to claim 1, which comprises generating the signal at a frequency from greater than 10 KHz to a multiple of 100 MHz.

7. The method according to claim 6, which comprises generating the signal at a frequency in a range from 200 MHz to 500 MHz.

8. The method according to claim 1, wherein the measuring line is a supply core conducting a current and the feeding step comprises superimposing the analog signal on the current.

9. The method according to claim 8, wherein the current transmitted on the measuring line is a direct current.

10. A measuring system for monitoring a line for a changed ambient condition, the measuring system comprising:
    a measuring line having a predetermined length and including a measuring conductor surrounded by an insulation;
    a signal generator for generating an analog signal with a predefined frequency, the analog signal being a periodic, continuously changing signal with a given frequency with steadily rising or falling amplitude;
    a voltmeter for measuring a signal amplitude at a fixed measuring site on said measuring conductor, wherein a changed ambient condition leads to a changed velocity of propagation of the signal and thus to a shift in the phase of the signal at a fixed measurement location, so that the signal amplitude varies at the fixed measurement location and that the signal amplitude is a measure for the changed ambient condition; and
    an evaluation unit connected to receive the signal amplitude and configured for ascertaining a measure for the changed condition based on the signal amplitude measured at the measuring site.

11. The measuring system according to claim 10, wherein said measuring line is open at one end thereof.

12. The measuring system according to claim 10, wherein said measuring line extends in a component to be monitored.

13. The measuring system according to claim 12, wherein said measuring line is configured for monitoring a temperature prevailing in the component.

14. The measuring system according to claim 10, wherein said measuring line is a supply core.

15. The measuring system according to claim 10, wherein said measuring line is a supply core of a charging cable.

16. The measuring system according to claim 12, wherein the component is a component selected from the group consisting of a cable, a thermally loaded component, and a compound that changes as a result of an exothermic or endothermic reaction.

17. The method according to claim 1, wherein the ascertained measure for the changed ambient condition is based only on the signal amplitude, and selectively drawing a conclusion as to the changed ambient condition from the signal amplitude by way of an algorithm, or by a comparison to comparison values or reference values for the measured signal amplitude.

* * * * *